(12) United States Patent
So et al.

(10) Patent No.: US 6,281,547 B1
(45) Date of Patent: Aug. 28, 2001

(54) POWER TRANSISTOR CELLS PROVIDED WITH RELIABLE TRENCHED SOURCE CONTACTS CONNECTED TO NARROWER SOURCE MANUFACTURED WITHOUT A SOURCE MASK

(75) Inventors: Koon Chong So, San Jose; Fwu-Iuan Hshieh, Saratoga, both of CA (US)

(73) Assignee: MegaMOS Corporation, San Jose, CA (US)

( * ) Notice: Subject to any disclaimer, the term of this patent is extended or adjusted under 35 U.S.C. 154(b) by 0 days.

(21) Appl. No.: 08/853,150

(22) Filed: May 8, 1997

(51) Int. Cl.[7] .................................................. H01L 29/76
(52) U.S. Cl. ...................... 257/330; 257/331; 257/401; 257/335
(58) Field of Search ................................ 257/330–334, 257/135, 401; 438/270–274

(56) References Cited

U.S. PATENT DOCUMENTS

| | | | | |
|---|---|---|---|---|
| 5,173,435 | * | 12/1992 | Harada ................................. | 257/328 |
| 5,414,290 | * | 5/1995 | Bauer ................................... | 257/401 |
| 5,721,148 | * | 2/1998 | Nishimura ............................. | 437/40 |
| 5,831,288 | * | 11/1998 | Singh et al. .......................... | 257/330 |
| 5,895,951 | * | 4/1999 | So et al. .............................. | 257/330 |

* cited by examiner

Primary Examiner—Tom Thomas
Assistant Examiner—Ori Nadav
(74) Attorney, Agent, or Firm—Bo-In Lin

(57) ABSTRACT

The present invention discloses a DMOS transistor cell, supported on a substrate of a first conductivity type. The DMOS transistor cell includes a body region of a second conductivity type disposed in the substrate defining a central portion of the cell. This DMOS transistor cell further includes a trench gate filled with polysilicon therein surrounding the body region and defining a boundary of the cell. This DMOS transistor cell further includes a source of the first conductivity type defined by a narrow strip of source region disposed in the body region along an edge thereof adjacent to the trench gate. This transistor cell further includes a source contact defined by a cross-shaped trench filled with polysilicon disposed in the body region and a trench edge source extension extending laterally between the narrow strip of source region and in electric contact thereto for providing area for electrically connecting to a source contact to be formed thereon whereby the source contact can be more conveniently manufactured provided with reliable good contact to the narrow strip of source region while achieving cost savings without requiring the use of a source mask.

10 Claims, 11 Drawing Sheets

POWER TRANSISTOR CELLS PROVIDED WITH RELIABLE TRENCHED SOURCE CONTACTS CONNECTED TO NARROWER SOURCE MANUFACTURED WITHOUT A SOURCE MASK

BACKGROUND OF THE INVENTION

1. Field of the Invention

This invention relates generally to the structure and fabrication process of trenched DMOS power transistors. More particularly, this invention relates to a novel and improved structure and process for fabricating a trenched DMOS power transistors manufactured without requiring a source mask and provided with specially configured trench edge source extension to shortened source regions wherein the risk of turning-on a parasitic bipolar transistor in the DMOS transistor is reduced and more reliable source contacts are provided.

2. Description of the Prior Art

As the width of the source regions are shortened to provide a special advantage of preventing an incidental turning on of the parasitic PN junctions, the narrowed source regions however generate a different technical difficulty that reliable source contacts cannot be conveniently formed due to the very small areas above the source regions with shortened width. The advantages provided by the narrower source regions cannot be practically realized due to the difficulties created by this limitation.

For semiconductor power devices, such as DMOS or IGRs, there are inherent concerns of the incidental turning-on or incipience of current conduction in a parasitic bipolar transistors in these type of devices. Partial or total loss of current control may be resulted from such incidental turning on events. Potential damages to the device or even complete destruction can be a sequence of such undesirable situations. Prevention measures are therefore required to circumvent the occurrences of such events in order to increase the ruggedness of the device. A typical prior art technique to prevent parasitic transistors from turning on is to provide "electrical short" or low resistance connection between the adjoining source and the base regions thus preventing the forward biasing above a threshold level of a P-N junction between them. In order to assure that no part of the P-N junctions is excessively forward biased, the distance between the short and the furthest part of the P-N junction, which generally is the width of the source region, should be minimized. Conventional method of device manufacture typically produce semiconductor devices with a source region which have width ranging from few micrometers to ten micrometers. Such widths are generally not satisfactory for the purpose of preventing the parasitic P-N junctions from being incidental turned on.

For a conventional fabrication method, the width of the source regions cannot be reduced beyond certain limits. These limits are imposed due to the precision limitations of mask alignment. First, the potential misalignment of source contact mask for opening contact windows above the narrow source regions impose a requirement that the contact windows have to be larger in size to assure direct contact with the narrow source region under a worst misalignment situation. However, a large contact window raise another concern that the source contact metal may incidentally contact the trench gates causing a short thus leading to a device malfunction. Due to these concerns, the source regions are required to maintain certain minimum width to compensate for potential errors caused by contact mask misalignment. Furthermore, for smaller size of source regions, a very stringent requirement on alignment is imposed on the trench etching windows. Due to the difficulty that the source regions and the trench gates are not self aligned, it is very difficult to precisely align the source regions relative to the trench gates. For this reason, the source regions cannot be made with further reduced size in order to accommodate trench mask misalignment errors. Thus, according to the conventional manufacture method, the width of the source regions cannot be reduced beyond certain limitations.

In order to overcome this difficulty, in U.S. Pat. No. 4,567,641, entitled "Method of Fabricating Semiconductor Devices having a Diffused Region of Reduced Length" (issued on Feb. 4, 1986), Baliga et al. disclose a semiconductor device having a diffused region of further reduced length by applying a different manufacture method. In this semiconductor device, e.g., MOSFET, a N+ source region is diffused into a P-base region through a window of diffused mask. An an-isotropic or directional etchant is applied to the N+ source region through the same widow. The etchant removes most of the N+ source region but allow the shoulder of the source region to remain intact. The remaining shoulder regions now become the source regions, having a reduced diffusion length thus greatly reducing the risk of turning-on a parasitic bipolar transistor in the MOSFET transistor.

The method of fabrication and the device structure of the MOSFET transistor as that disclosed by Baliga et al. cause another difficulty. The shortened source region allows very limited areas for the source contact. In order to overcome this difficulty, special arrangements are made to provide tunnel junction as low resistance contact between the source region and the source contact as that shown in FIG. 1. In this MOSFET 80 by Baliga et al., a P+ region 58 is provided to complete an electrical short between the P-base 56 and a N+ source region 66. The electrical short consists of three components. A first component is a junction 82 between the P region 58 and the N+ source 66 where a tunnel junction 82 is formed because each of these regions are heavily doped, e.g., each region are doped with $10^{19}$ dopant atoms per cubic centimeter of silicon. The tunnel junction 82 constitutes a low resistance connection between the N+ source region 66 and the P+ region 58 during normal device operation. The second component of the electrical short is provided at a location E includes a the junction 84 between the P-base 56 and the P+ region 58. The junction 84 constitutes a low resistance path between the P-base 56 and the P+ region 58 because the holes can freely pass from the P-base 56 to the P+ region 58. The third component of the electrical short at the location E includes the P+ region 58, in the vicinity of location E, between the tunnel junction 82 and the junction 84. This is because the region 58 is highly doped and thus constitutes a low resistance path between the junctions 82 and 84. All these three low resistance paths collectively provide a low resistance path between the P-base 56 and the source region 66.

The device structure of providing an electrical short by combining three components of low resistance paths is very complicate and therefore difficult to control the quality of the electrical paths with predictable resistance. Very accurate control of many parameters during the fabrication process are required in order to assure good quality low resistance electrical paths are achieved for this kind of device structure. The device as disclosed by Baliga et al. may appear advantageous in theory but practically, such a device may be too complicate for actual implementation. Furthermore, the resistance between the source metal and the N+ source is high, especially when the drain to source voltage $V_{DS}$ is small. Such a device may become difficult to switch for a low on-resistance power MOSFET device.

Therefore, there a need still exits in the art of power device fabrication, particularly for DMOS design and fabrication, to provide a structure and fabrication process that would resolve these difficulties. Specifically, it is desirable that shortened source regions can be manufactured on the semiconductor while direct and reliable source contact can also be formed with simplified manufacture processes such that power transistors of increased ruggedness can be manufactured with reliable performance without unduly incurring increased production costs.

SUMMARY OF THE PRESENT INVENTION

It is therefore an object of the present invention to provide a novel and improved trenched DMOS structure, and fabrication process to overcome the aforementioned difficulties and limitations encountered in the prior art.

Specifically, it is an object of the present invention to provide an improved trenched DMOS structure and fabrication process by simply applying a specially configured trench mask provided with openings above the body regions to form specially shaped trenches to form trench edge source-extension whereby reliable source contacts are conveniently formed.

Another object of the present invention is to provide an improved trenched DMOS structure and fabrication process by employing specially configured trench mask with trenches opened in the body regions for carrying out a source implant over the trench mask to form trench edge source-extension for forming source contact metal thereon whereby a reliable source can be conveniently manufactured without being limited by the narrow width of the source regions.

Another object of the present invention is to provide an improved trenched DMOS structure and fabrication process by employing specially configured trench mask for opening trenches in the body regions and for carrying out a source implant over the trench mask to trench edge source-extension for forming source contact metal thereon whereby a reliable source can be conveniently manufactured without increasing any increase in manufacture costs or applying more complicated processing steps.

Another object of the present invention is to provide an improved trenched DMOS structure and fabrication process by employing specially configured trench mask for opening trenches in the body regions and for carrying out a source implant over the trench mask to trench edge source-extension for forming source contact metal thereon whereby a reliable source can be conveniently manufactured without requiring a separate source mask to achieve cost savings in manufacturing the DMOS transistors.

Briefly, this invention discloses a preferred embodiment which is DMOS transistor on a substrate with specially configured source contacts formed in the trenches in the p-body regions extending over the p-body to touch the source regions. This improved DMOS transistor with novel cell structure is manufactured by an improved method to provide better source contacts formed in the trenches. The method of manufacturing this improved DMOS transistor is form a DMOS transistor on a substrate with specially configured trench mask to provide trenches filled with polysilicon disposed in a center portion of the DMOS cells such that the DMOS cells which are made with very short source width can be provided with good and reliable source contacts. The method includes the steps of: (a) forming an epi-layer of a first conductivity type as a drain region on the substrate and then growing an initial oxide layer over the epi-layer; (b) applying an active layer for etching the initial oxide layer to define an active area; (c) performing a blank body implant with impurities of a second conductivity type followed by a body-diffusion process at an elevated temperature thus forming a body layer; (d) applying a trench mask including a plurality of specially configured source contact trenches; (e) performing a source implant with impurities of a first conductivity type followed by a source diffusion at an elevated temperature thus forming a plurality of source regions and trench edge source-extension; (f) etching a plurality of trenches and source contact trenches in the substrate; and (e) removing the trench mask followed by carrying out steps to form a gate and the trenched source contacts in each of the trenches.

In a preferred embodiment, this invention discloses a DMOS transistor cell, supported on a substrate of a first conductivity type. The DMOS transistor cell includes a body region of a second conductivity type disposed in the substrate defining a central portion of the cell. This DMOS transistor cell further includes a trench gate filled with polysilicon therein surrounding the body region and defining a boundary of the cell. This DMOS transistor cell further includes a source of the first conductivity type defined by a narrow strip of source region disposed in the body region along an edge thereof adjacent to the trench gate. This transistor cell further includes a source contact defined by a trench-edge source-extension surrounding the cross-shaped trenches filled with polysilicon disposed in the body region wherein said source-extension extending laterally between the narrow strip of source region and in electric contact thereto for providing area for electrically connecting to a source contact to be formed thereon whereby the source contact can be more conveniently manufactured provided with reliable good contact with the narrow strip of source region.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1:
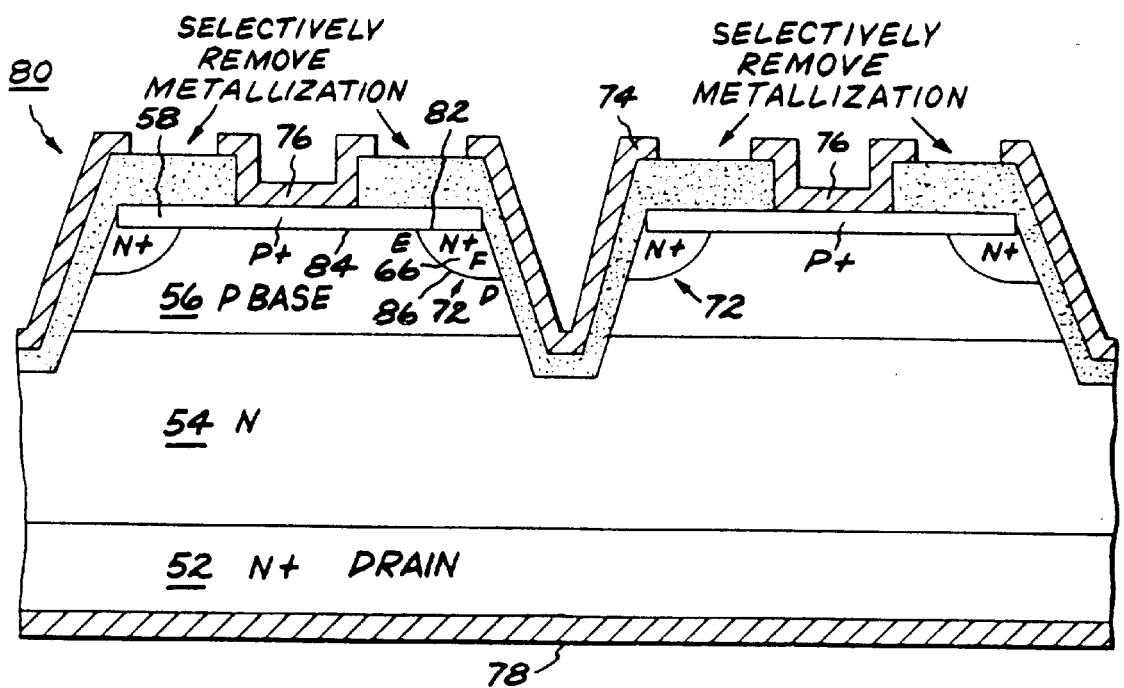
FIG. 1 is a cross-sectional view of a prior art structure of a trenched semiconductor transistor with a shortened source and a structure to form the three-component source contacts.
Figure 2A:
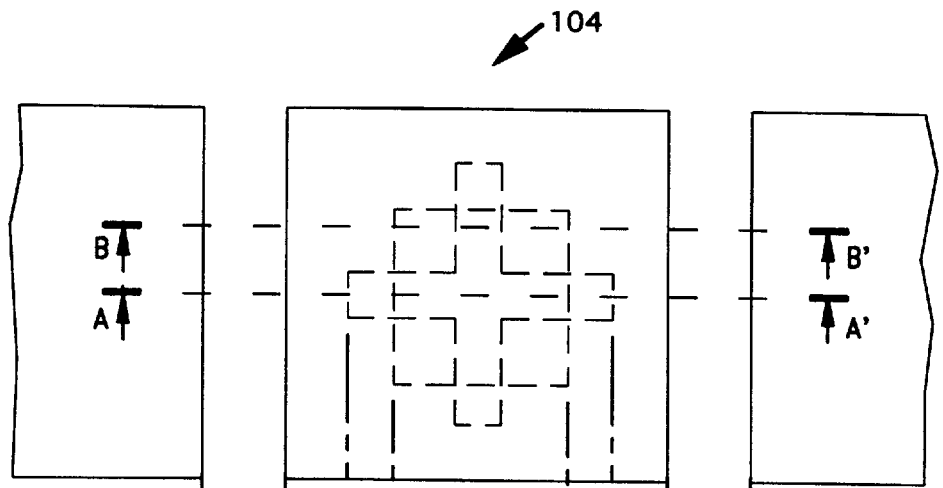
FIGS. 2A to 2C are cross-sectional views of a trenched DMOS transistor of the present invention with trenched-source contact specially opened in the body regions.
Figure 2B:
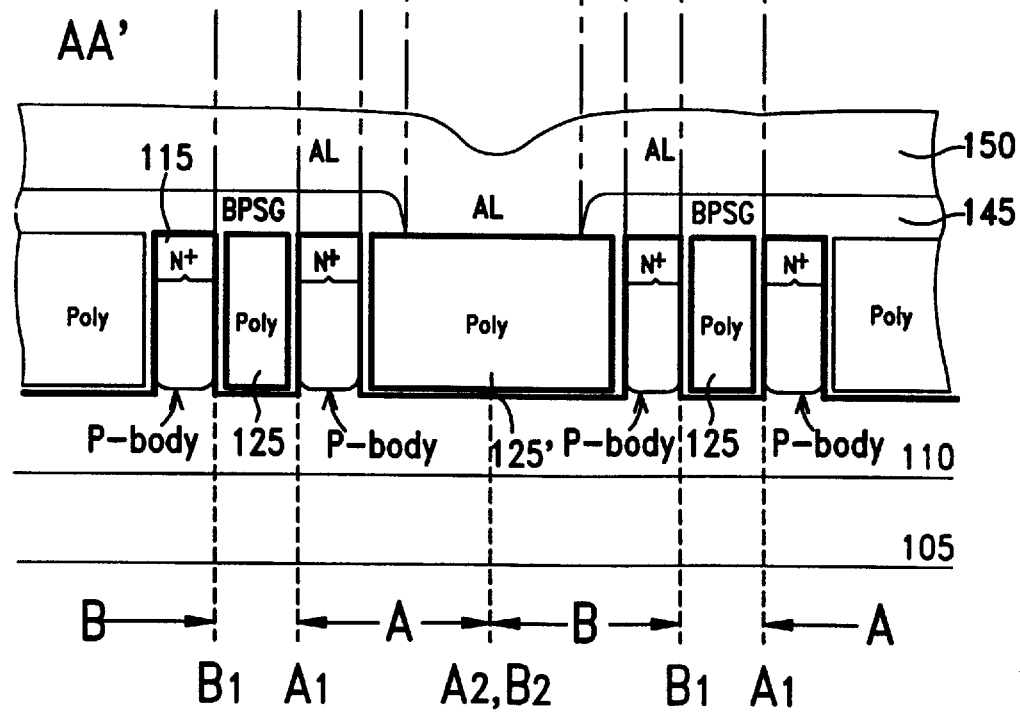
Figure 2C:
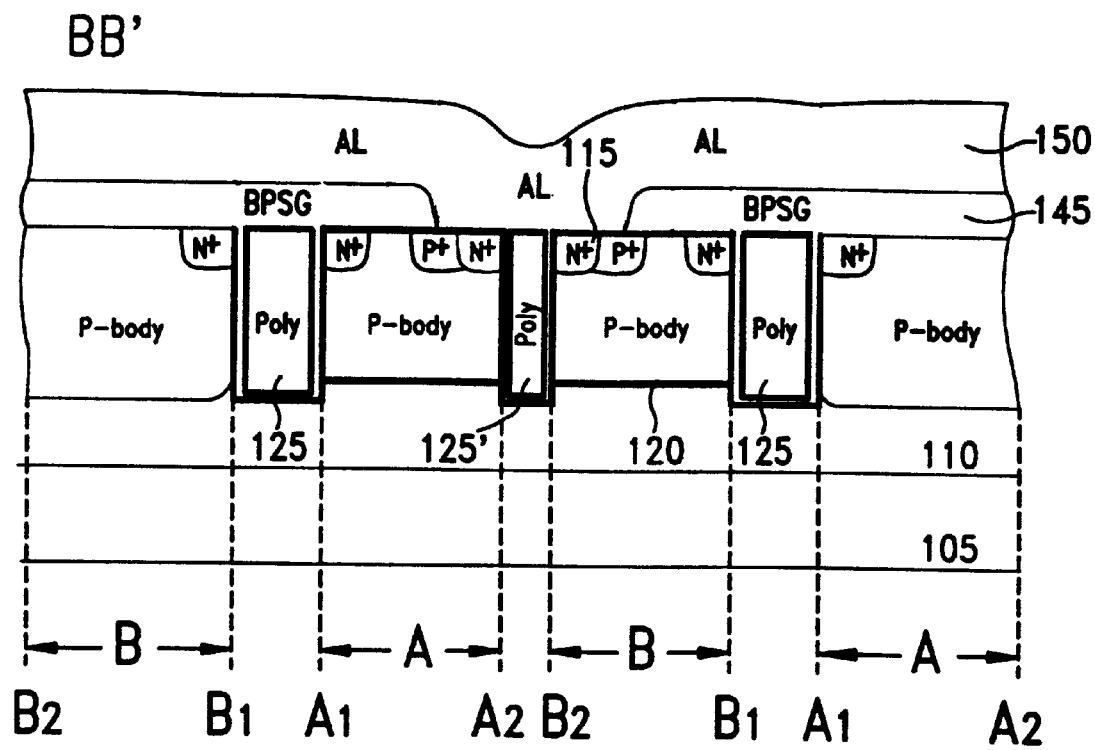

FIGS. 2A is a top view and FIGS. 2B and 2C are cross sectional views along A-A' and B-B' respectively of a DMOS transistor 100 according to the present invention. The DMOS transistor 100 is formed on a N+ substrate 105 supporting a N epi-layer 110 thereon. The N-epi layer 110 together with the substrate 105 constitutes a common drain region for the DMOS transistor 100. The DMOS transistor 100 includes a plurality of transistor cells 104 each surrounded by gates 125 formed in a trench. The DMOS transistor cell 104 includes a p-body region 120 disposed above the N-epi layer 110. Near the top portions of the p-body region 120 along the trenched gate 125, near the outer edges of the transistor cell 104, the DMOS transistor cell 104 further includes a source region 115. A novel structural feature included in the DMOS cell 104 is a trenched source contact 125' formed in the middle portion of the p-body 120 extending laterally across the p-body thus contacting the source region 115 along the edges of the transistor cell 104. The trenched source contacts 125 are formed in a trench filled with polysilicon therein. As shown in these drawings, the source contact trenches are formed to laterally extend across the p-body region to directly touch the n-source regions which are formed with very narrow width. The polysilicon filling the source contact trenches thus provide electrical connections to the source regions near the edges of the transistor cell 104.

A layer of metal contact 150 is thenformed thereon to provide direct electric connection through opening in a BPSG layer 145 to the source regions 115 through these trenched source contacts 125'. The DMOS transistor cell 104 as shown in FIGS. 2A to 2C are manufactured with very narrow source regions 115. However, by providing these specially configured trenched-source contacts 125 surrounded by trench edge source extension 115' in the p-body region 120, the problems of the prior art are resolved. With these trench edge source extension 115', the difficulties caused by the limitations of insufficient areas provided for source contacts as the device patented by Baliga et al., i.e., U.S. Pat. No. 4,567,641, are eliminated. The specially configured trench edge source extension 115' formed around the trenches 125' provides a further advantage that the cell structure of this novel configuration can be manufactured with almost identical processing steps as that applied in a typical conventional manufacture process. The only difference for manufacturing this novel cell structure is to apply a specially configured trench mask. Therefore, there is no increase in production costs, nor does it complicate the manufacture processes as that described below.

Therefore, the present invention discloses a DMOS transistor cell 104 supported on a substrate 105 of a first conductivity type. The DMOS transistor cell includes a body region 120 of a second conductivity type disposed in the substrate defining a central portion of the cell. This DMOS transistor cell further includes a trench gate 125 filled with polysilicon therein surrounding the body region 120 and defining a boundary of the cell. This DMOS transistor cell 104 further includes a source 115 of the first conductivity type defined by a narrow strip of source region 115 disposed in the body region 120 along an edge thereof adjacent to the trench gate 125'. This transistor cell 104 further includes a source contact 125' defined by a cross-shaped trench filled with polysilicon disposed in the body region 120 surrounded by a trench edge source extension 115' extending laterally between the narrow strip of source region 115 and in electric contact thereto for providing area for electrically connecting to a source contact 150 to be formed thereon whereby the source contact 125' can be more conveniently manufactured provided with reliable good contact with the narrow strip of source region 115.

In summary, this invention also discloses power transistor cell 104 supported on a semiconductor substrate 105. This power transistor cell includes a body region 120 disposed in the substrate 105 defining a central portion of the cell 104. This power transistor cell further includes a trench gate 125 filled with conductive material therein surrounding the body region 120 and defining a boundary of the cell 104. This power transistor cell further includes a source region 115 disposed in the body region 120 adjacent to the trench gate 125'. This power transistor cell 104 further includes a source contact 125' defined by a source contact trench filled with a conductive material therein surrounded by a trench edge source extension 115' disposed in the body region 120 and in electrical contact with the source region 115 for providing a more reliable source connection thereto. In a preferred embodiment, the power transistor cell 104 further includes an insulating layer covering the transistor cell 104 wherein a contact window is defined above the source contact trench 125' with contact metal 150 filled therein for contacting the trench edge source extension 115' surrounding the source contact trench 125' and connected to the source region 115 therefrom. In a preferred embodiment, the source region 115 having a width ranging from 0.2 to 0.8 $\mu$m and the source contact trench 125' having a trench width ranging from 0.5 to 2.0 $\mu$m whereby a transistor cell of narrow source is provided with improved ruggedness while maintaining reliable source contact connected by the trench edge source extension 115' disposed around the source contact trench 125' extended thereto.

Figure 2D:
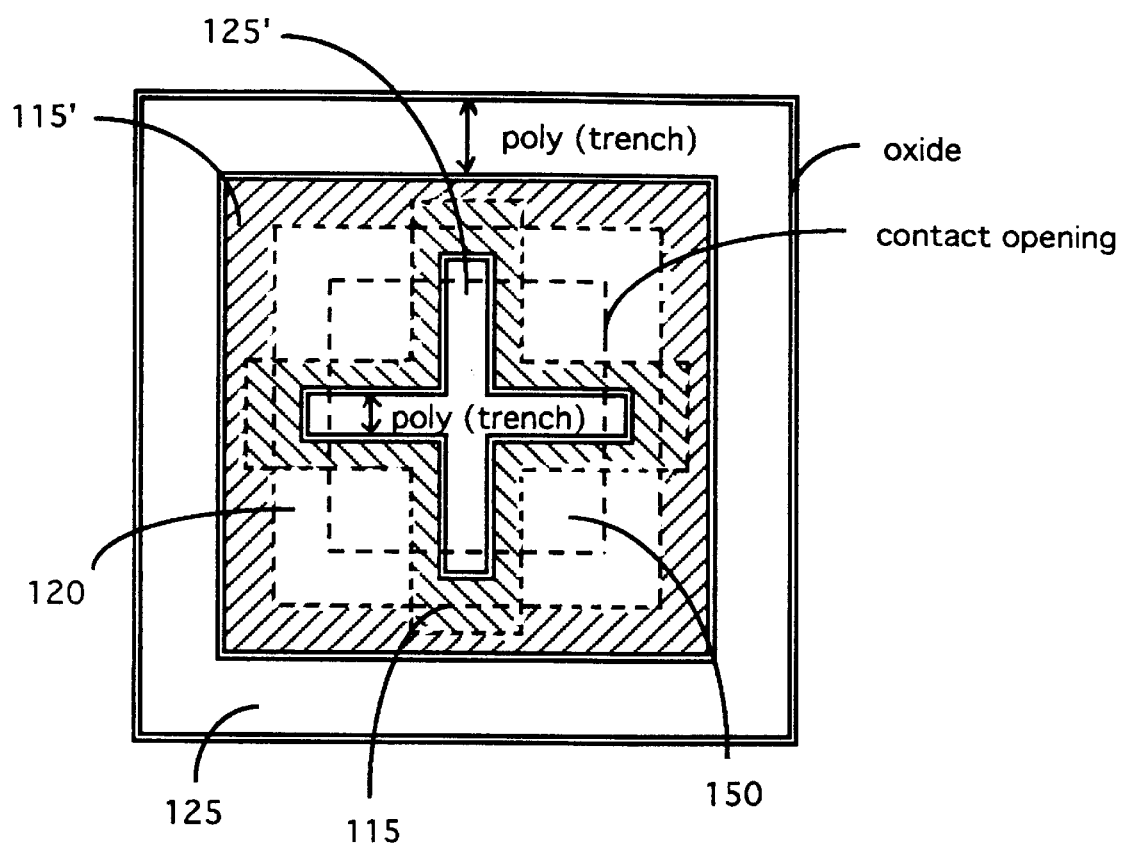
FIG. 2D is a top view of the trenched DMOS transistor which is manufactured according the process flow depicted in FIGS. 3A to 3G below.

FIG. 2D is a top view of the trenched DMOS transistor cell 104 as described above and which is manufactured according the process flow depicted in FIGS. 3A to 3G below. As shown in FIG. 2D, the DMOS cell 104 is supported on a substrate 105 of a first conductivity type, a N-type substrate. The DMOS transistor cell 104 includes a body region 120 of a second conductivity type, e.g., a p-type body, disposed in the substrate defining a central portion of the cell 104. The DMOS transistor cell 104 further includes a trench gate 125 filled with polysilicon therein surrounding the body region 120 and defining a boundary of the cell 104. The DMOS transistor cell further includes a source of the first conductivity type, e.g., a N-type source region 115, defined by a narrow strip of source region 115 disposed in the body region along an edge thereof adjacent to the trench gate 125. The DMOS transistor cell 104 further includes a source contact 125' defined by a cross-shaped trench 125' filled with polysilicon disposed in the body region 120 surrounded by a trench edge source extension 115' extending laterally between the narrow strip of source region 115 and in electric contact thereto for providing area for electrically connecting to a metal source contact 150 to be formed thereon whereby the metal source contact 150 can be more conveniently manufactured provided with reliable good contact with the narrow strip of source region 115. The shaded areas are to show that the source region 115 is implanted without requiring a source mask. A trench mask is used to carry out the source implant first followed by a diffusion operation. Then the trench mask is utilized to open the trenches for the gate 125 and the cross-shaped source contact trench 125'. The shaded areas along the trenches illustrate that there is a narrow strip of N-type region diffused from a N-implant in forming the source region 115 applying the trench mask. There is also a narrow strip of N-doped region along the cross-shaped source contact trenches 125' formed in the central portion of the transistor cell 104.

Figure 3A:
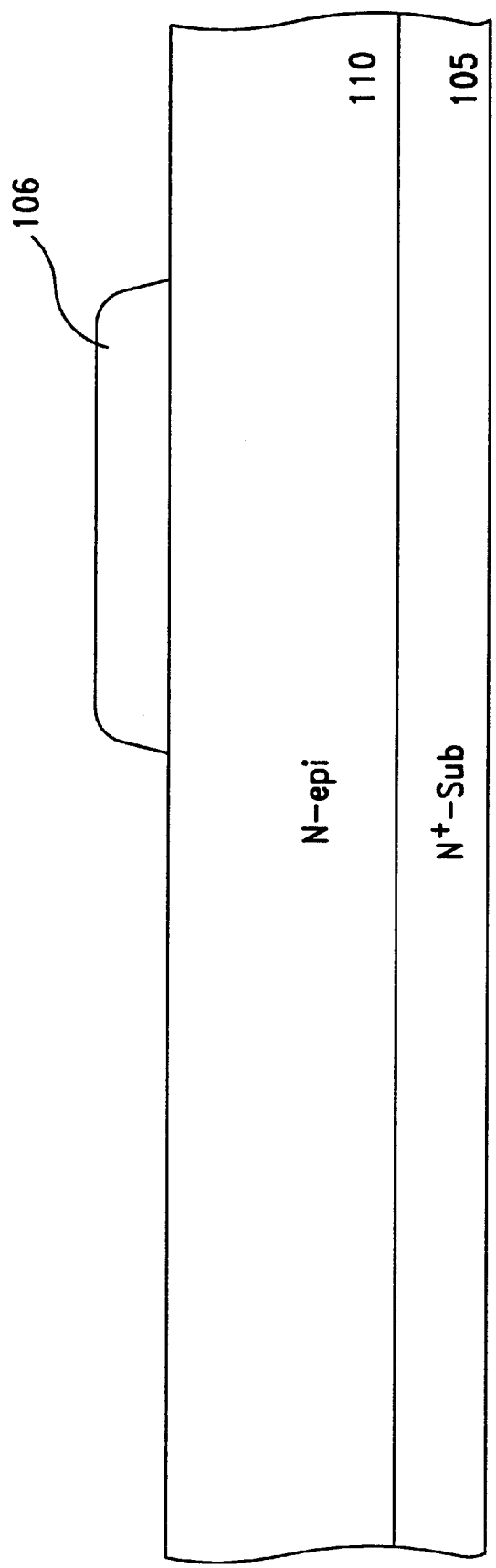
FIGS. 3A to 3G are cross sectional views to show the processing steps for manufacturing a trenched DMOS transistor according to the present invention wherein a novel source contact trenches are opened in the body regions to provide trenched source contact.

Please refer to FIGS. 3A to 3G for the processing steps for manufacturing the power DMOS device 100 described above. As shown in FIG. 3A, the processing steps begins by first growing a N epitaxial layer 110 with a resistivity ranging from 0.1 to 1.0 ohm-cm on top of a N+ substrate 105. The substrate has a resistivity of 0.001 to 0.007 ohm-cm. The thickness and the resistivity of the epitaxial layer 110 depend on the device requirements for the on-resistance and breakdown voltage. In a preferred embodiment, the thickness of the epi-layer 110 is about three to twenty microns (3–20 μm). An initial oxidation process is performed to grow an oxide layer 106 ranging from 5,000 to 10,000 Å and active mask is employed to remove the initial oxide layer 106 to define the active regions.

Figure 3B:
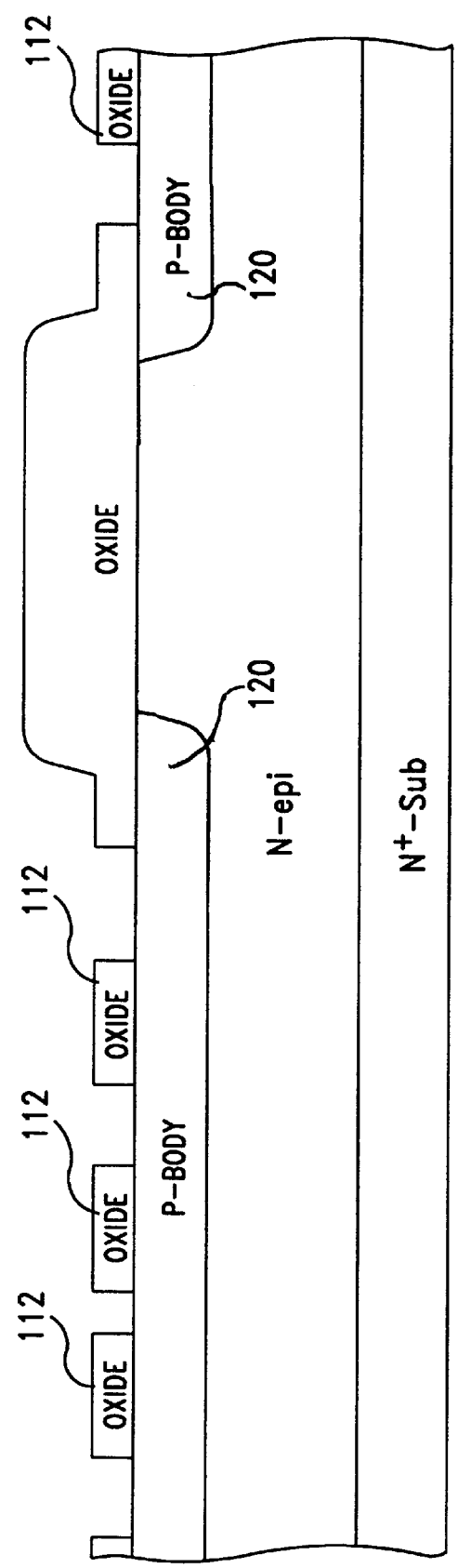

Referring to FIG. 3B, a blank p-boy implant is carried out with boron ions at 30–100 Kev with an ion beam of $2\times10^{13}$ to $2\times10^{14}/cm^2$ flux density to form the p-body region 120. A p-body diffusion process is then carried out at an elevated temperature of 1,000–1,200° C. for ten minutes to three hours to increase the depth of the p-body region 120 to 1.0–2.0μ. An oxide layer 112, with a thickness ranging from 1000 to 4000 angstroms, is deposited on the top surface as the trench mask to form the trench gate 125 and the trench source contact 125' as that shown FIGS. 2A to 2C.

Figure 3C:
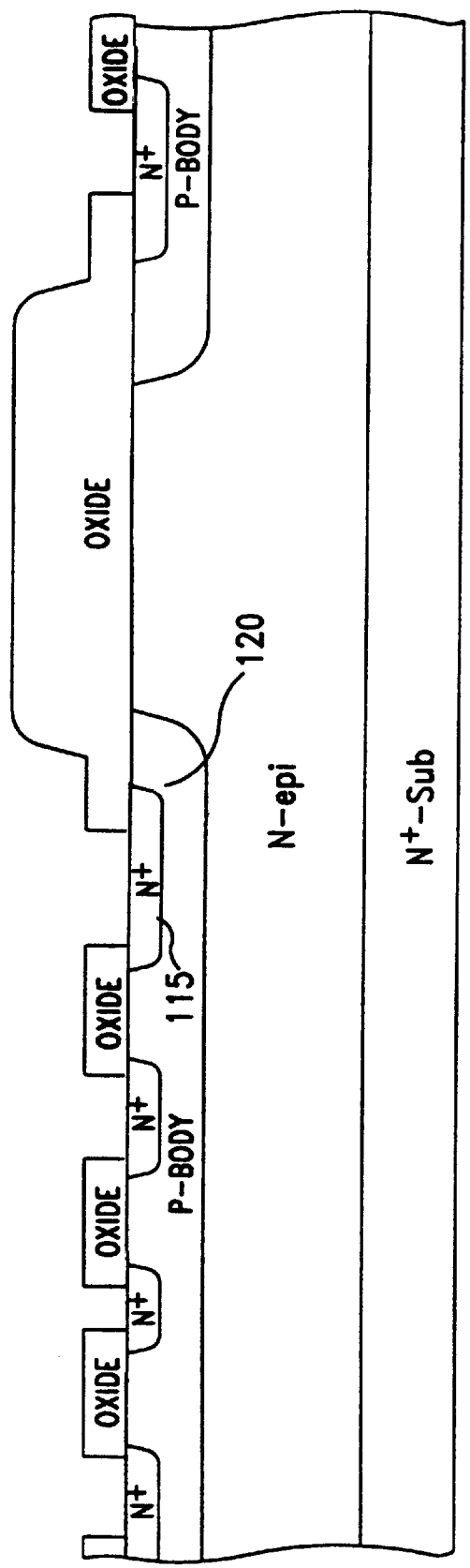

Referring to FIG. 3C, with the trench mask 112 in place, a N+ implant to form the N+ region 115 is carried out. The N+ implantation is carried out with an arsenic or phosphorus ion beam at an energy of 40–100 Kev and ion flux density of $5\times10^{15}$ to $1\times10^{16}/cm^2$. The N+ source regions 115 and a trench-edge source extension 115' surrounding the trenches opened in the body regions are driven into desired junction depth ranging from 0.2 to 1.0μ by a diffusion process at a temperature of 900–1000° C. for 10 minutes to two hours. Therefore, the source regions 115 and the trench-edge source extension 115' are formed without employing a source mask. Cost savings are achieved by the novel fabrication process of this invention when less masks are employed in manufacturing the MOSFET device.

Figure 3D:
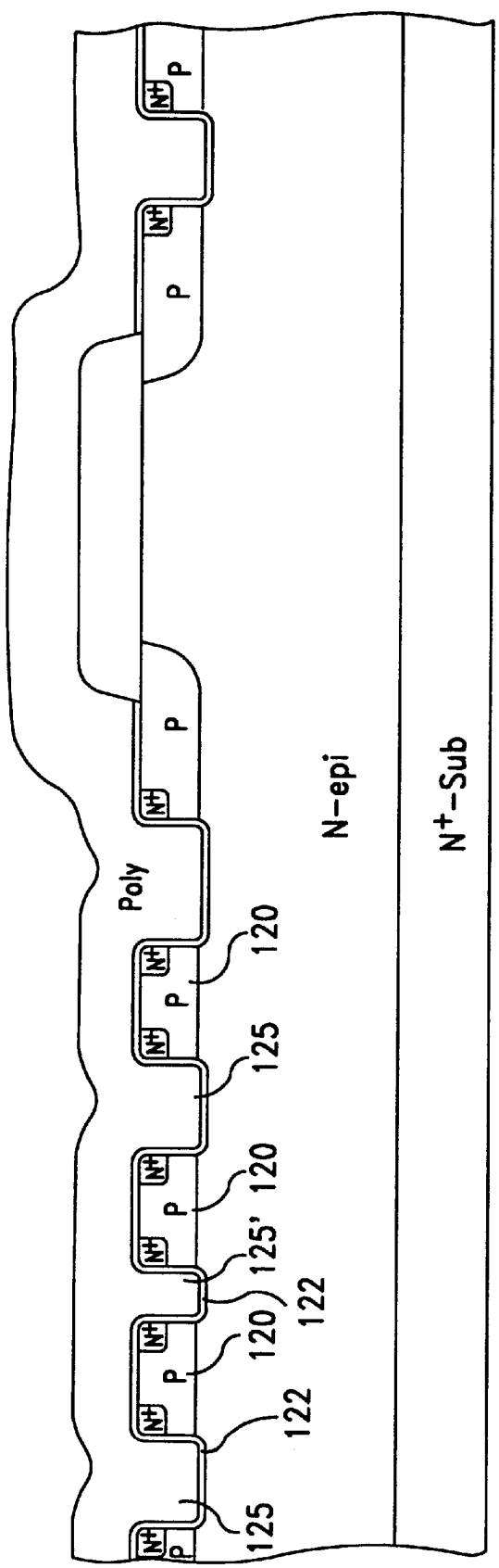
Figure 3E:
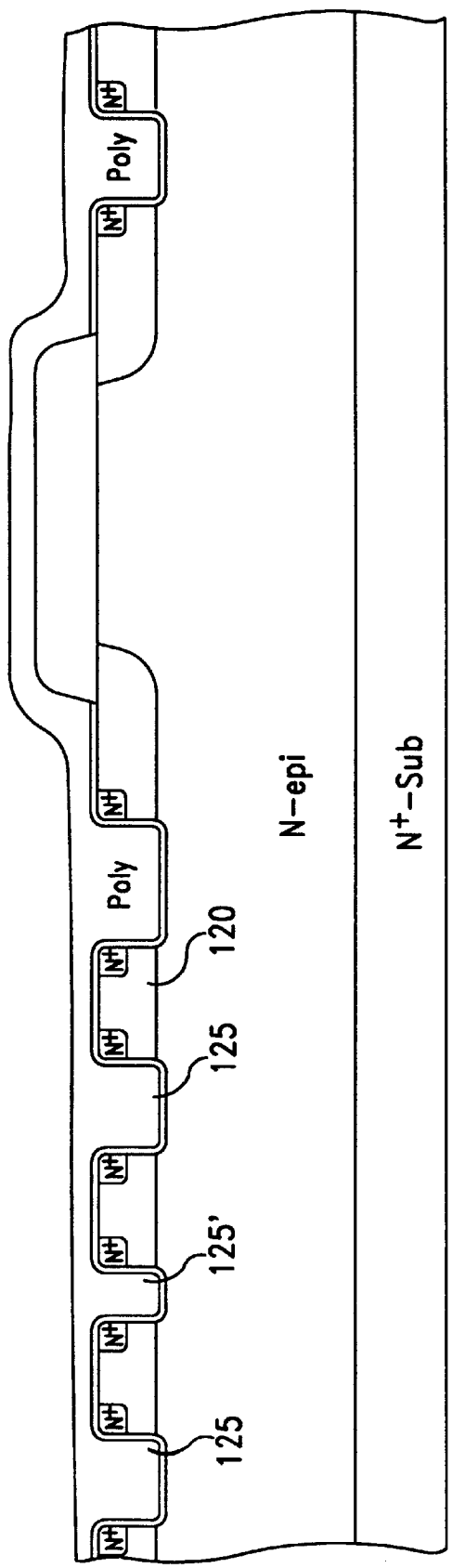

Referring to FIG. 3D with the patterned oxide layer 112 employed as a trench mask, a trench etch process is performed. It is to be noted that the trench mask 112 is specially configured to provide openings for etching the source-contact trenches 125' to form a plurality of source-contact trenched-connections therein which will be further described below. A trench etch process, which is a dry an-isotropic etch process, is applied to form trenches of 1.0 to 2.0 microns in width and 1.0 to 2.0 micron in depth. A sacrification oxidation process is applied which can be either a dry or wet oxidation process conducted at a temperature of 900–1100° C. to form oxide layer of approximately 300–2000 Å in thickness which is followed by a scarification oxide etch process. A gate oxide layer 122 is then formed by a gate oxidation process which can be a wet or dry oxidation process carried out at a temperature of 800 to 1100° C. to form a layer of thickness in the range of 200 to 1,000 Å. A poly deposition process is performed to deposit a poly layer 125 and 125' ranging from 1.5 to 3.0μ in thickness. Referring to FIG. 3E, a planarization etch is performed to form a planar surface by etching a top layer to 0.2–0.5μ from the deposited poly. A POCL$_3$ doping process is carried out at 950° C. to make the poly layer 125 have a sheet resistance of 20–40 ohm/cm$^2$.

Figure 3F:
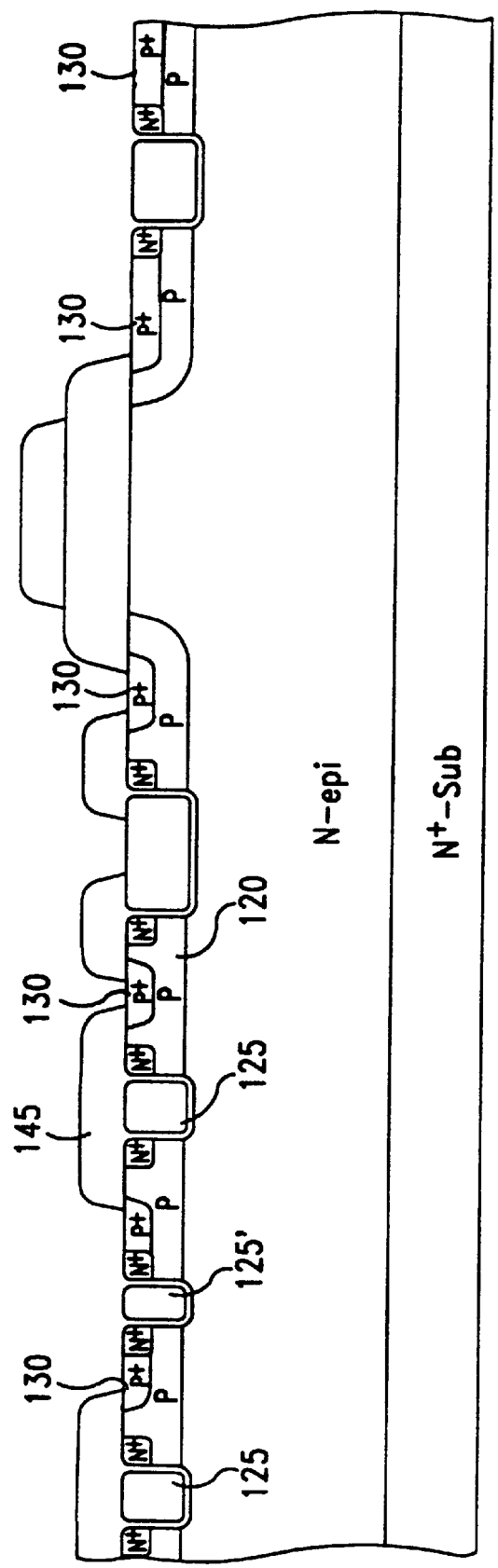

Referring to FIG. 3F, where a polysilicon etch is carried out to dry etch the polysilicon layer 125, including the specially configured source-contact trenched connection 125', till the top surface is removed with the end-point detection to terminate the etch process when the polysilicon layer above the trench is removed. A BPSG or PSG is deposited to form a layer 145 of approximately 5000–15,000 Å in thickness. A BPSG flow or BSG densification process is performed at 900–950° C. for thirty minutes to one hour. A contact mask (not shown) is applied to perform a dry etch process to define the contacts windows in order to be ready for making source and gate contacts. A blank boron implant with an ion beam of 20–50 Kev and ion flux of $10^{15}$ to $1\times10^{16}/cm^2$ is carried out to form the p+ regions 130 for providing a low-resistance body contact of the DMOS cell.

Figure 3G:
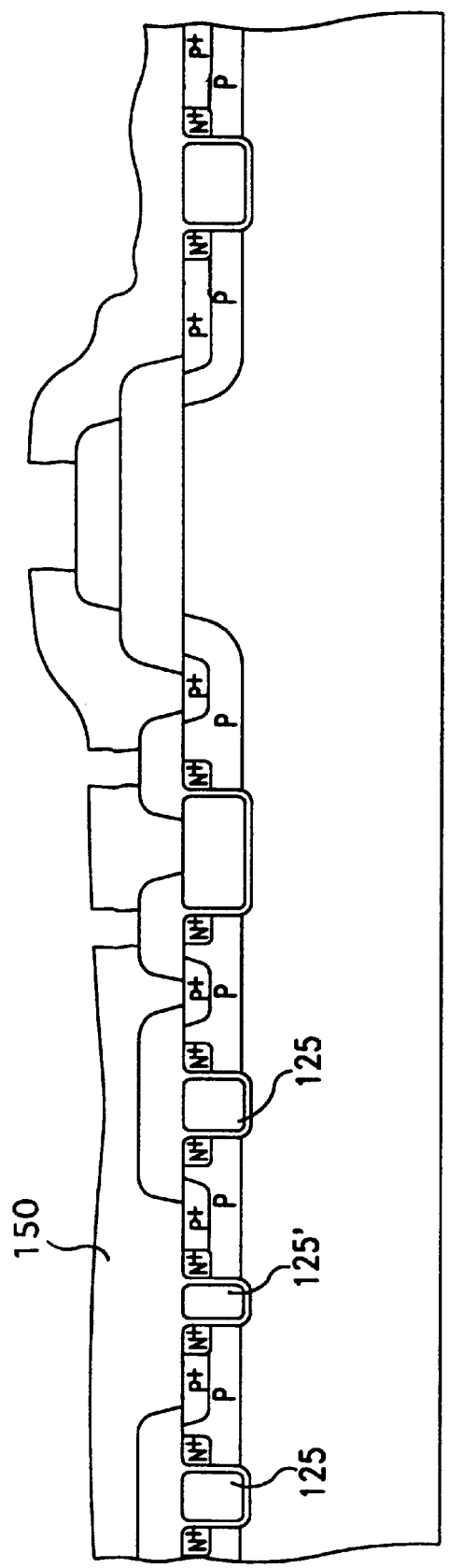

Referring to FIG. 3G, a metal deposition process is carried out to form an overlaying metal layer. The final DMOS transistor 100 is completed by applying a metal mask to pattern the source contact 150, the gate contact, the field plate and the channel stop (CS). A source-contact trenched connections 125' are formed in each cell as that shown FIGS. 2A to 2C wherein each of these DMOS cells can be made with source regions having very short width while good and reliable contacts are provided with specially configured source contact trenched connections 125'.

In summary, this invention discloses a method for fabricating a DMOS transistor 100 on a substrate 105 with specially configured trench mask to provide trenches filled with conductive polysilicon disposed in a center portion of the DMOS cells surrounded by a trench-edge source extension 115' such that the DMOS cells which are made with very short source width can be provided with good and reliable source contacts. The method includes the steps of: (a) forming an epi-layer 110 of a first conductivity type as a drain region on the substrate and then growing an initial oxide layer over the epi-layer; (b) applying an active layer for etching the initial oxide layer to define an active area; (c) performing a blank body implant with impurities of a second conductivity type followed by a body-diffusion process at an elevated temperature thus forming a body layer 120; (d) applying a trench mask including a specially configured source contact trench to first carrying out a source implant followed by a source diffusion to form a source region and a trench-edge source extension without requiring a source mask; and (e) applying the trench mask or etching a plurality of gate trenches and source contact trenches in the substrate wherein the source contact trenches extending laterally in the body layer. In a preferred embodiment, the method for fabricating the transistor further includes a step of: (f) removing the trench mask followed by carrying out steps to form a gate in each of the trenches and a source contact in each of the source contact trenches. In a preferred embodiment, the step (e) of applying a trench mask for etching a plurality of gate trenches and source contact trenches in the substrate further includes a step of applying the trench mask to etch a plurality of gates trenches and source contact trenches leaving a narrow strip of source implant region along the trenches. In yet another preferred embodiment, the step (f) of carrying out steps to form a gate in each of the trenches and a source contact in each of the source contact trenches is a step of depositing a polysilicon in each of the gate trenches and the source contact trenches. In yet another preferred embodiment, the method further includes a step (g) forming an insulation layer covering the transistor followed by applying a contact mask for opening a source contact window above the source contact for forming a source contact therein by filling a conductive material in the source contact window thus contacting the source regions through an interconnection of the source contact in the source contact trenches laterally extending to the source regions.

Therefore, the present invention provides an improved trenched DMOS structure, and fabrication process to overcome the difficulties of poor and unreliable source contacts and higher metal-to-source resistance as encountered in the prior art. Specifically, an improved trenched DMOS transistor is disclosed by simply applying a specially configured trench mask provided with openings above the body regions to form specially shaped trenches and source contacts with a trench edge source extension whereby reliable source contacts are conveniently formed. By employing this specially configured trenches opened in the body regions and a trench edge source extension surrounding the trenches for contacting the source regions whereby a reliable source can be conveniently manufactured without being limited by the narrow width of the source regions and furthermore such contacts can be made with further cost savings because the device can be manufactured without requiring the use of a source mask.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A DMOS transistor cell, supported on a substrate of a first conductivity type, comprising:

a body region of a second conductivity type disposed in said substrate defining a central portion of said cell;

a trench gate filled with polysilicon therein surrounding said body region and defining a boundary of said cell;

a source of said first conductivity type defined by a narrow strip of source region disposed along an edge of said trench gate thus said narrow strip of said source region constituting an outer boundary surrounding said body region;

said body region further comprising a cross-shaped trench filled with polysilicon horizontally extended to said source region near said outer boundary surrounding said body region; and a source contact region constituting a narrow strip region of said first conductivity type along said cross shaped trench and in electrical contact with said source region.

2. The DMOS transistor cell of claim 1 further comprising:

an insulating layer covering said transistor cell having a contact window opened above said source contact with contact metal filled therein for contacting said source contact and electrically connected to said source region therefrom.

3. The DMOS transistor cell of claim 1 wherein:

said narrow strip of source region having a width ranging from 0.2 to 0.8 $\mu$m and said cross-shaped trench having a trench width ranging from 0.5 to 2.0 $\mu$m whereby a transistor cell of narrow source is provided with improved ruggedness while maintaining reliable source contact connected by said source contact along said cross-shaped trench extended to said source region.

4. The DMOS transistor cell of claim 1 wherein:

said substrate of a first conductivity type is a N-type conductivity substrate and said body region of a second conductivity type is a P-type conductivity body.

5. The DMOS transistor cell of claim 1 wherein:

said substrate of a first conductivity type is a P-type conductivity substrate and said body region of a second conductivity type is a N-type conductivity body.

6. A power transistor cell, supported on a semiconductor substrate, comprising:

a body region disposed in said substrate defining a central portion of said cell;

a trench gate filled with conductive material therein surrounding said body region and defining a boundary of said cell;

a source region disposed along an edge of said trench gate thus constituting a narrow strip of source region constituting an outer boundary surrounding said body region;

said body region further comprising a horizontally-extended elongated source contact trench filled with a conductive material therein extended horizontally to said source region; and a source contact disposed along an horizontal edge of said source contact trench thus extended horizontally to and in electrical contact with said source region for providing a more reliable source connection thereto.

7. The power transistor cell of claim 6 further comprising:

an insulating layer covering said transistor cell having a contact window opened above said source contact with contact metal filled therein for contacting said source contact and electrically connected to said source region therefrom.

8. The power transistor cell of claim 6 wherein:

said source region having a width ranging from 0.2 to 0.8 $\mu$m and said cross-shaped trench having a trench width ranging from 0.5 to 2.0 $\mu$m whereby a transistor cell of narrow source is provided with improved ruggedness while maintaining reliable source contact connected by said source contact along said cross-shaped trench extended to said source region.

9. The power transistor cell of claim 6 wherein:

said substrate being a first conductivity type is a N-type conductivity substrate and said body region being a second conductivity type is a P-type conductivity body.

10. The power transistor cell of claim 6 wherein:

said substrate being a first conductivity type is a P-type conductivity substrate and said body region being a second conductivity type is a N-type conductivity body.

* * * * *